United States Patent
Baba

(10) Patent No.: US 8,772,753 B2
(45) Date of Patent: Jul. 8, 2014

(54) NONVOLATILE SEMICONDUCTOR STORAGE DEVICE

(75) Inventor: Masanobu Baba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/596,395

(22) Filed: Aug. 28, 2012

(65) Prior Publication Data

US 2013/0234095 A1  Sep. 12, 2013

(30) Foreign Application Priority Data

Mar. 7, 2012  (JP) ................................. 2012-051027

(51) Int. Cl.
H01L 47/00 (2006.01)

(52) U.S. Cl.
USPC .......................... 257/4; 257/214; 257/E21.679

(58) Field of Classification Search
USPC ....................................... 257/4, 214, E21.679
See application file for complete search history.

(56) References Cited

U.S. PATENT DOCUMENTS

2006/0011897 A1* 1/2006 Hsu et al. ...................... 252/500
2006/0050598 A1* 3/2006 Rinerson et al. ............. 365/232
2007/0099125 A1* 5/2007 Chen et al. ..................... 430/311
2008/0173975 A1* 7/2008 Chen et al. ..................... 257/529
2011/0194329 A1 8/2011 Ohba et al.

FOREIGN PATENT DOCUMENTS

| JP | 2007-329273 | 12/2007 |
| JP | 2010-177654 | 8/2010 |
| JP | 2010-212541 | 9/2010 |

* cited by examiner

Primary Examiner — Dale E Page
(74) Attorney, Agent, or Firm — Finnegan, Henderson, Farabow, Garrett & Dunner, L.L.P.

(57) ABSTRACT

A nonvolatile semiconductor storage device includes a word line, a first electrode, a high resistance ion diffusion layer, a second electrode, and a bit line. The word line is made of a conductive material extending in a first direction. The first electrode is provided on the word line. The high resistance ion diffusion layer is provided on the first electrode. The second electrode is provided on the ion diffusion layer and configured to supply a metal into the ion diffusion layer upon application of a positive voltage relative to the first electrode. The bit line is provided on the second electrode and made of a conductive material extending in a second direction orthogonal to the first direction. The ion diffusion layer contains oxygen at a higher concentration on the word line side than on the bit line side.

12 Claims, 7 Drawing Sheets

NONVOLATILE SEMICONDUCTOR STORAGE DEVICE

CROSS-REFERENCE TO RELATED APPLICATION

This application is based upon and claims the benefit of priority from the prior Japanese Patent Application No. 2012-051027, filed on Mar. 7, 2012; the entire contents of which are incorporated herein by reference.

FIELD

Embodiments described herein relate generally to a nonvolatile semiconductor storage device including cross-point memory cells.

BACKGROUND

In nonvolatile semiconductor storage devices currently in the mainstream, as represented by NAND flash memories, the memory cell is constituted by a charge accumulation transistor. In the charge accumulation transistor, a charge accumulation layer is formed in the insulating film between the channel layer and the gate electrode. Accumulation of charge in this charge accumulation layer changes the threshold voltage of the charge accumulation transistor. This is utilized to perform writing and reading of information. In order to increase the capacity in such a nonvolatile semiconductor storage device, further miniaturization of the charge accumulation transistor is required. However, as the insulating film for retaining charge is made thinner, the leakage current is increased, and hence the charge retention capability is degraded. Thus, in a nonvolatile semiconductor storage device using charge accumulation transistors as memory cells, the increase of capacity is becoming difficult.

In this context, a nonvolatile semiconductor storage device with cross-point memory cells arrayed in a memory cell array has been drawing attention. The cross-point memory cell includes a variable resistance element as a memory element at the intersection between a word line and a bit line. In such a nonvolatile semiconductor storage device, the change of the resistance of the memory cell is used as information. Thus, compared with the memory cell of the charge accumulation type, miniaturization causes less degradation in the storage retention operation. Hence, the nonvolatile semiconductor storage device including cross-point memory cells is promising for increasing the capacity. In particular, CBRAM (conductive bridging random access memory) is promising as a cross-point nonvolatile semiconductor storage device. In CBRAM, metal ions are diffused in the diffusion layer sandwiched between the electrodes of the memory cell. Thus, the formation of a current path connecting the electrodes is controlled to change the resistance of the memory cell. Furthermore, in conjunction with the variable resistance characteristics, the memory cell of CBRAM has rectification characteristics as well. In the cross-point nonvolatile semiconductor device, in general, in the read operation, a reverse bias is applied to the non-selected memory cells. Thus, the current flowing into the non-selected memory cell needs to be suppressed. Hence, a rectifying element such as a diode needs to be series connected to the memory cell. However, in CBRAM, the memory cell itself has rectification characteristics. This eliminates the need of additional connection of a rectifying element. Thus, because of the simplified structure of the memory cell, CBRAM is promising for increasing the capacity.

However, if the size of the memory cell is 10 nm or less, it is difficult to control the formation of the current path by diffusion of metal ions. For instance, metal ions may be excessively diffused into the diffusion layer. This increases variations in the switching characteristics for repeating the ON state and the OFF state of the memory cell. Furthermore, the durability in the switching characteristics may be degraded. As the memory cell size becomes smaller, the influence of excessive diffusion of metal ions is greater. With the decrease of the resistance of the memory cell, the rectification characteristics are also degraded, and the reverse current increases. On the other hand, if the ion diffusion layer is made of a material suppressing the diffusion of metal ions, the ion diffusion layer has poorer adhesiveness to the electrode serving as a diffusion source of metal ions. Consequently, in the manufacturing process, voids are generated at the interface between the electrode and the ion diffusion layer. This causes the yield decrease and failures of the cells. There is demand for CBRAM including memory cells with good adhesiveness between the ion diffusion layer and the electrode serving as a diffusion source, good rectification characteristics, and high durability in the switching characteristics.

DETAILED DESCRIPTION

Figure 1:
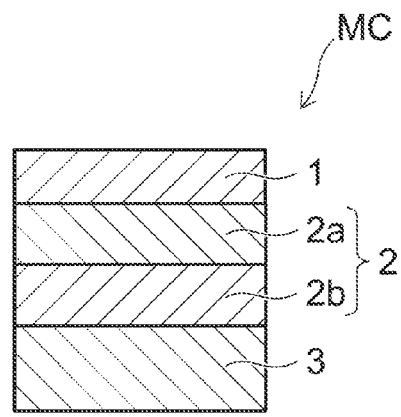
FIG. 1 is a main part schematic sectional view of the nonvolatile semiconductor storage device according to a first embodiment.

A nonvolatile semiconductor storage device includes a word line, a first electrode, a high resistance ion diffusion layer, a second electrode, and a bit line. The word line is made of a conductive material extending in a first direction. The first electrode is provided on the word line and electrically connected to the word line. The high resistance ion diffusion layer is provided on the first electrode on opposite side from the word line and electrically connected to the first electrode. The second electrode is provided on the ion diffusion layer on opposite side from the word line and configured to supply a metal into the ion diffusion layer upon application of a positive voltage relative to the first electrode. The bit line is provided on the second electrode on opposite side from the word line, electrically connected to the second electrode, and made of a conductive material extending in a second direction orthogonal to the first direction. The second electrode is composed of the metal supplied into the ion diffusion layer. The ion diffusion layer contains oxygen at a higher concentration on the word line side than on the bit line side.

Embodiments of the invention will now be described with reference to the drawings. The drawings used to describe the embodiments are schematic for simplicity of description. The shape, dimension, size relation and the like of the components in the drawings do not necessarily need to be realized as shown in actual practice, but can be suitably modified as long as the effect of the invention is achieved.

First Embodiment

Figure 2:
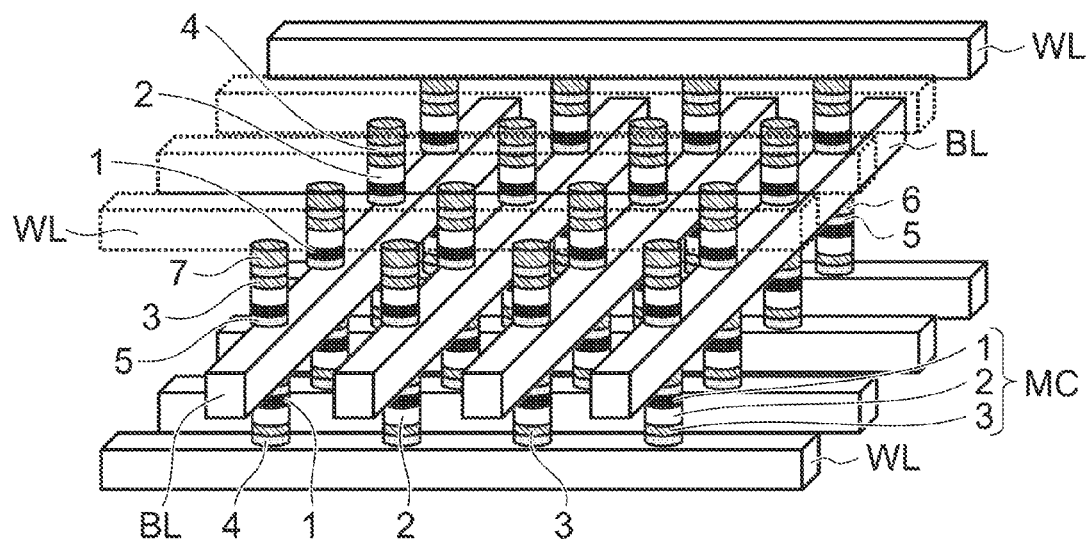
FIG. 2 is a main part schematic perspective view of the nonvolatile semiconductor storage device according to the first embodiment.
Figure 3:
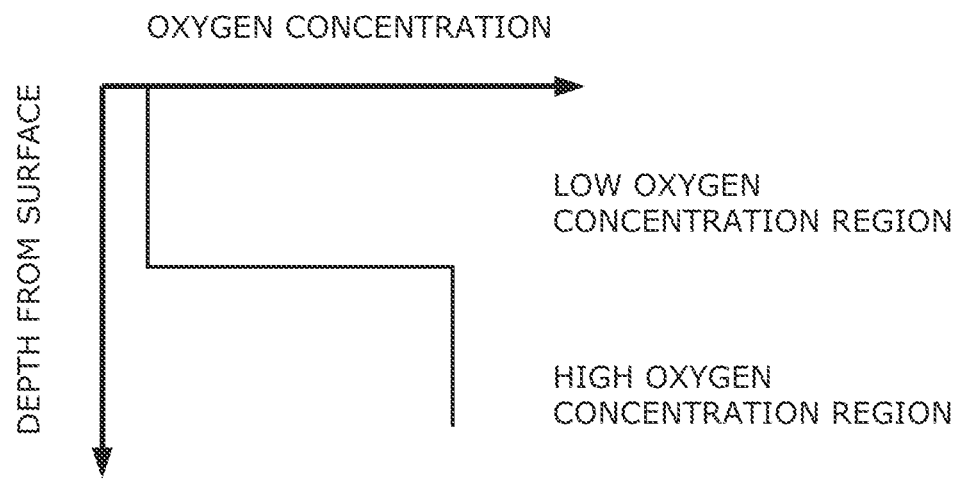
FIG. 3 is a graph of the concentration of oxygen in the ion diffusion layer of the nonvolatile semiconductor storage device according to the first embodiment.
Figure 4:
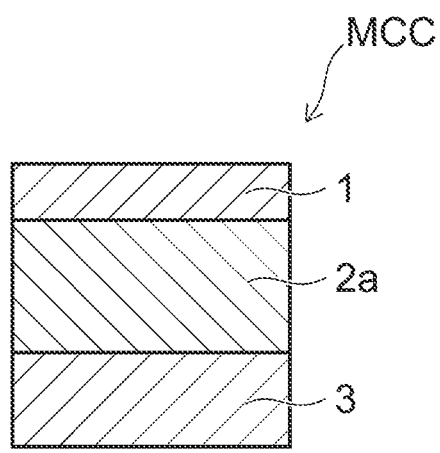
FIG. 4 is a main part schematic sectional view of a nonvolatile semiconductor storage device of a comparative example.
Figure 5A:
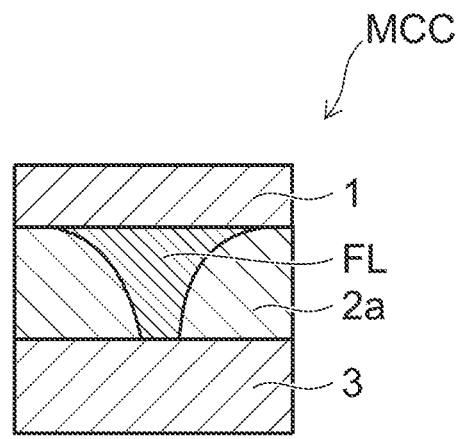
FIG. 5A is a main part schematic sectional view of a nonvolatile semiconductor storage device of the comparative example in operation.
Figure 5B:
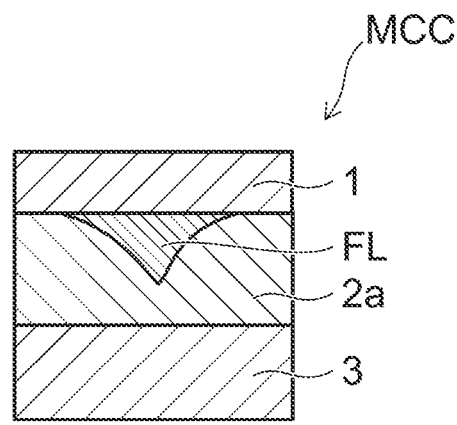
FIG. 5B is a main part schematic sectional view of a nonvolatile semiconductor storage device of the comparative example in operation.
Figure 6:
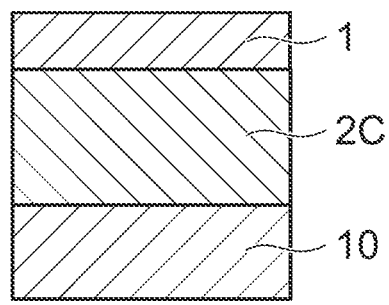
FIG. 6 is a sectional view of a sample for describing the feature of the nonvolatile semiconductor storage device according to the first embodiment.
Figure 7:
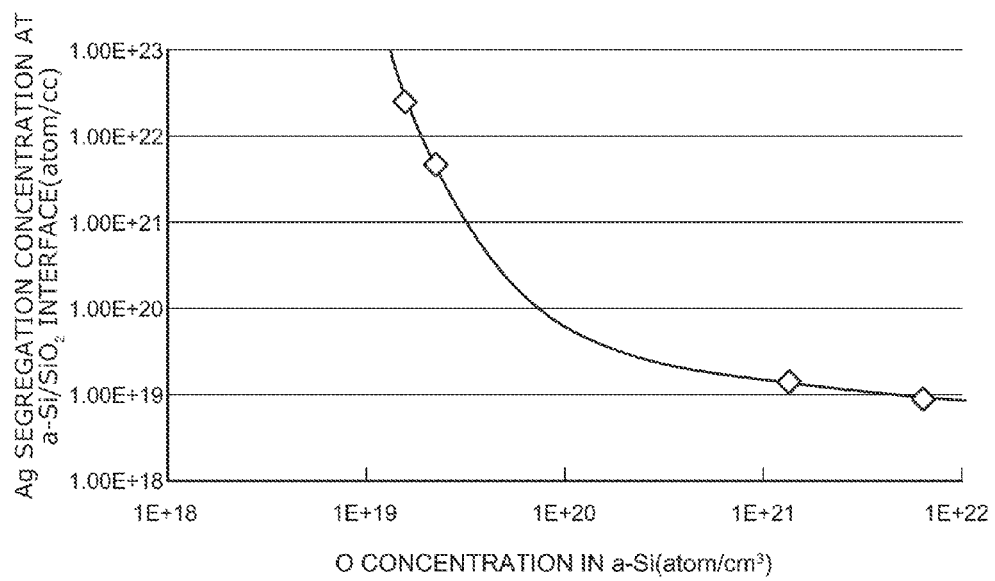
FIG. 7 is a graph describing the feature of the nonvolatile semiconductor storage device according to the first embodiment.
Figure 8:
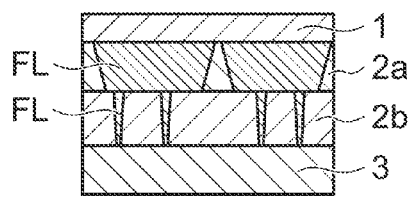
FIG. 8 is a main part schematic sectional view of a nonvolatile semiconductor storage device according to the first embodiment in operation.

With reference to FIGS. 1 to 8, a CBRAM, which is a nonvolatile semiconductor storage device according to a first embodiment of the invention, is described. FIG. 1 is a main part schematic sectional view of the nonvolatile semiconductor storage device according to the first embodiment, showing a memory cell of the nonvolatile semiconductor storage device according to the first embodiment. FIG. 2 is a main part schematic perspective view of the nonvolatile semiconductor storage device according to the first embodiment, showing a main part of the memory cell array of the nonvolatile semiconductor storage device according to the first embodiment. FIG. 3 shows the distribution of the concentration of oxygen in the ion diffusion layer of the nonvolatile semiconductor storage device according to the first embodiment. FIG. 4 is a main part schematic sectional view of a nonvolatile semiconductor storage device of a comparative example. FIG. 5A and FIG. 5B describe the operation of the nonvolatile semiconductor storage device of the comparative example. FIG. 6 is a sectional view of a sample for describing the feature of the nonvolatile semiconductor storage device according to the first embodiment. FIG. 7 describes the feature of the nonvolatile semiconductor storage device according to the first embodiment. FIG. 8 describes the operation of the nonvolatile semiconductor storage device according to the first embodiment.

As shown in FIG. 1, in the memory cell MC of the nonvolatile semiconductor storage device according to this embodiment, an ion diffusion layer 2 is provided on a lower electrode 3. The ion diffusion layer 2 is electrically connected to the upper surface of the lower electrode 3. The lower electrode 3 only needs to be made of a conductive material, such as n-type polysilicon. Alternatively, it can be p-type polysilicon or metal material. The metal material is preferably a material composed of a metallic element less likely to diffuse into the ion diffusion layer 2. As described later, in the case where the ion diffusion layer 2 according to this embodiment is composed of silicon (Si), the metal material is preferably e.g. titanium nitride (TIN), molybdenum (Mo), or tantalum (Ta).

The ion diffusion layer 2 only needs to be a high resistance layer, such as amorphous silicon (a-Si) composed of silicon not intentionally doped with n-type impurity or p-type impurity. Instead of amorphous silicon, the ion diffusion layer 2 can be made of polysilicon. With reference to the depth profile of oxygen concentration in the ion diffusion layer 2 as shown in FIG. 3, the ion diffusion layer 2 includes a high oxygen concentration region 2b on the lower electrode 3 side, and a low oxygen concentration region 2a on the upper electrode 1 side. The high oxygen concentration region 2b is intentionally doped with oxygen so as to contain oxygen at higher concentration than the low oxygen concentration region 2a. The low oxygen concentration region 2a is not intentionally doped with oxygen.

In this embodiment, because the low oxygen concentration region 2a is not intentionally doped with oxygen, the low oxygen concentration region 2a has a background oxygen concentration of the apparatus for film formation of amorphous silicon. The high oxygen concentration region 2b is intentionally doped with oxygen. Thus, the high oxygen concentration region 2b has an oxygen concentration of e.g. $1 \times 10^{20}/cm^3$ or more, nearly constant in the film thickness direction. The thickness of the low oxygen concentration region is set to the range of 2-10 nm, such as 5 nm. The thickness of the high oxygen concentration region is set to the range of 2-10 nm, such as 5 nm.

An upper electrode 1 is provided on the ion diffusion layer 2. The upper electrode 1 is electrically connected to the upper surface of the ion diffusion layer 2. The upper electrode 1 is composed of a metal diffusing from the upper electrode 1 into the ion diffusion layer 2 upon application of a positive voltage relative to the lower electrode 3. In this embodiment, the upper electrode 1 is composed of e.g. silver (Ag). Silver is less likely to be coupled to silicon, and hence can easily diffuse in the amorphous silicon by the voltage applied in the amorphous silicon. Besides silver, any metal diffusing in the ion diffusion layer can be used for the upper electrode 1. For instance, in the case where the ion diffusion layer 2 is formed from silicon, the upper electrode can be made of e.g. copper (Cu), aluminum (Al), cobalt (Co), nickel (Ni), or titanium (Ti).

As shown in FIG. 2, the memory cell array is formed by alternately stacking a plurality of word lines WL extending along an arbitrary direction and a plurality of bit lines BL extending along the direction orthogonal to these word lines. An interlayer insulating film, not shown, is provided between the word lines WL, between the bit lines BL, and between the word line WL and the bit line BL. At the intersection (cross point) between the word line WL and the bit line BL, a memory cell MC is provided via a hole provided in the interlayer insulating film. The lower electrode 3 is electrically connected to the word line WL. The upper electrode 1 is electrically connected to the bit line BL.

That is, the memory cell MC is provided on a word line WL in a first word line wiring layer including a plurality of word lines WL in its plane. The lower electrode 3 is electrically connected to this word line WL. On the upper electrode 1 of this memory cell MC, a bit line BL is provided so as to be electrically connected to this upper electrode 1. This bit line BL constitutes a first bit line wiring layer including a plurality of bit lines BL in its plane.

On the bit line BL in this first bit line wiring layer, a memory cell MC is provided upside down with respect to the memory cell provided on the word line WL in the aforementioned first word line wiring layer. The upper electrode 1 of this memory cell is electrically connected to this bit line BL. On the lower electrode 3 of this memory cell, a word line WL is provided so as to be electrically connected to this lower electrode 3. This word line WL constitutes a second word line wiring layer including a plurality of word lines WL in its plane.

The structure between the first word line wiring layer and the second word line wiring layer described above is repeated in the stacking direction to constitute a memory cell array of the nonvolatile semiconductor storage device according to this embodiment. By selecting one bit line BL and one word line WL, one memory cell MC is selected. Then, writing, reading, or erasing of information is performed.

Next, the storage retention operation in the memory cell MC is described. To describe the effect according to this embodiment, first, the storage retention operation is described with reference to a memory cell MCC of a comparative example. As shown in FIG. 4, the ion diffusion layer 2a of the memory cell MCC of the comparative example includes only the portion corresponding to the low oxygen concentration region 2a of the ion diffusion layer 2 according to this embodiment. For instance, the thickness of the ion diffusion layer 2a of the memory cell MCC according to the comparative example is 10 nm, equal to the thickness of the ion diffusion layer according to this embodiment. The oxygen concentration of the ion diffusion layer 2a of the memory cell MCC according to the comparative example is equal to the oxygen concentration of the low oxygen concentration region of the ion diffusion layer according to this embodiment. With regard to the structure other than the foregoing, there is no difference between the nonvolatile semiconductor storage device according to the comparative example and the nonvolatile semiconductor storage device according to this embodiment.

Through the bit line BL, a positive voltage relative to the lower electrode 3 is applied to the upper electrode 1 of the memory cell MCC. Then, from the upper electrode 1 toward the lower electrode 3, silver ions are diffused into the ion diffusion layer 2a. At the interface between the upper electrode 1 and the ion diffusion layer 2a, from the portion where the concentration of silver ions is increased, silver ions are precipitated in the ion diffusion layer 2a. As the application voltage is increased, a silver filament FL starts to extend from the upper electrode 1 toward the lower electrode 3. If the application voltage exceeds a threshold $V_{th}$, then as shown in FIG. 5A, the tip of the filament FL reaches the lower electrode 3. Thus, a current path is formed from the upper electrode 1 to the lower electrode 3. Hence, a current flows from the upper electrode 1 toward the lower electrode 3, and the memory cell MCC is turned to the ON state. This is the state in which information is written to the memory cell MCC, and corresponds to the logical value "1". Even if the application voltage is set to zero, the ON state is retained.

As shown in FIG. 5B, if a negative voltage relative to the lower electrode 3 is applied to the upper electrode 1 of the memory cell MCC, then silver ions are diffused from the lower electrode 3 side toward the upper electrode 1. As the reverse bias voltage is increased, the filament FL shrinks toward the upper electrode 1. Consequently, the tip of the filament FL is separated from the upper surface of the lower electrode 3. Thus, the current path is broken, and the current ceases to flow in the memory cell MCC.

However, while the applied reverse bias voltage is low, a large part of the filament remains in the ion diffusion layer 2a. Thus, if a forward bias voltage is applied again, the tip of the filament is immediately brought into contact with the upper surface of the lower electrode 3, and the current flows. Hence, in the case where the applied voltage is low, i.e., in the case where a small signal voltage is applied, the memory cell MCC has rectification characteristics in the ON state. Here, if a higher reverse bias voltage is applied to the memory cell MCC, the filament is retracted to the upper electrode 1 side and almost eliminated in the ion diffusion layer 2a. Thus, the memory cell MCC is turned to the OFF state. This is the state in which information is erased from the memory cell, and corresponds to the logical value "0". In this OFF state, the ON state is not recovered unless the forward bias voltage is increased to the order of the threshold voltage $V_{th}$ at the write time.

In general, in the cross-point memory cell array, in reading data from a selected memory cell by selecting a bit line BL and a word line WL, the selected memory cell MCC is subjected to a forward bias voltage as low as the aforementioned small signal voltage. Information is read by sensing the flow of current in the memory cell MCC. The non-selected memory cell MCC connected to the non-selected bit line BL and the non-selected word line WL is subjected to a reverse bias voltage with the same magnitude. Thus, in the non-selected memory cell, a waste current flows and increases the power consumption. Furthermore, this waste current may also cause the failure of the memory cell.

Thus, in general, the cross-point memory cell array needs a rectifying element in series with the memory cell to avoid the flow of current when the memory cell is reverse biased. However, in CBRAM of the comparative example and this embodiment, the memory cell itself has the aforementioned rectification characteristics. This eliminates the need of series connection of a rectifying element to the memory cell.

In CBRAM, in order to improve switching between the ON state and the OFF state described above, i.e., the switching characteristics, it is preferable that the diffusion of metal ions in the ion diffusion layer 2 be strong so that a filament is easily formed. In the memory cell MCC according to the comparative example, the upper electrode 1 is made of silver, and the ion diffusion layer 2a is made of non-doped amorphous silicon not intentionally doped with impurity. Silver ions are relatively likely to diffuse in amorphous silicon. Thus, a filament is easily formed, and the switching characteristics are favorable.

However, in the case of miniaturizing the memory cells to improve bit cells, excessively strong filament formation results in poor rectification characteristics. More specifically, silver ions excessively reach the lower electrode 3 side, and the contact area between the filament FL and the upper surface of the lower electrode 3 is made too large. Then, at a low reverse bias voltage, the tip of the filament FL is not easily separated from the upper surface of the lower electrode 3. Thus, a current flows in the non-selected memory cell. This increases the power consumption or causes the degradation of memory cells.

Thus, in this embodiment, the diffusion of silver ions in the ion diffusion layer 2 is suppressed to some extent to improve the rectification characteristics while keeping good switching characteristics. In the following, an example of suppressing the diffusion of silver ions is described.

As shown in FIG. 6, a sample in which amorphous silicon $2c$ and a silver electrode 1 are formed on silicon oxide ($SiO_2$) 10 was prepared. The amorphous silicon $2c$ is doped with oxygen to a desired concentration. By heat treatment, silver ions are diffused in the amorphous silicon from the silver electrode 1. Upon reaching the surface of the silicon oxide 10, silver segregates at the interface between the amorphous silicon $2c$ and the silicon oxide 10. The heat treatment was performed in a vacuum at 400° C. FIG. 7 shows the relationship in this case between the segregation concentration of silver at the interface between the amorphous silicon (a-Si) $2c$ and the silicon oxide ($SiO_2$) 10, and the oxygen concentration in the amorphous silicon $2c$. The segregation concentration of silver is the peak value of silver concentration obtained by analyzing the depth profile of oxygen using SIMS (secondary ion mass spectrometry).

As seen from FIG. 7, with the increase of oxygen concentration in the amorphous silicon $2c$, the segregation concentration of silver at the interface between the amorphous silicon $2c$ and the silicon oxide 10 decreases exponentially. Approximately from the oxygen concentration exceeding $1\times10^{20}/cm^3$, the decrease of the segregation concentration of silver tends to be saturated. The decrease of the segregation concentration of silver means the suppression of the diffusion of silver ions in the amorphous silicon $2c$ from the silver electrode toward the silicon oxide 10. Thus, as the oxygen concentration in the amorphous silicon $2c$ becomes higher, the diffusion of silver ions in the amorphous silicon is suppressed. In particular, if the oxygen concentration in the amorphous silicon $2c$ exceeds $1\times10^{20}/cm^3$, the suppression of the diffusion of silver ions in the amorphous silicon starts to be saturated. Thus, the diffusion of silver ions in the amorphous silicon $2c$ is stably suppressed, and the variations are small.

In the nonvolatile semiconductor storage device according to this embodiment, oxygen is contained in amorphous silicon at high concentration to utilize the effect of suppressing the diffusion of silver in the amorphous silicon. As shown in FIG. 1, the memory cell MC according to this embodiment is different from the memory cell MCC according to the comparative example in including a high oxygen concentration region $2b$ in the ion diffusion layer. This suppresses excessive electrical contact of the silver filament FL with the lower electrode 3 due to excessive diffusion of silver in the ion diffusion layer 2.

As shown in FIG. 8, in the memory cell MC according to this embodiment, if a forward bias voltage is applied to the memory cell and the voltage is increased, then in the low oxygen concentration region $2a$ of the ion diffusion layer 2, silver ions are rapidly diffused. Thus, a silver filament FL rapidly extends toward the lower electrode. In the high oxygen concentration region $2b$, the oxygen concentration is higher than in the low oxygen concentration region $2a$, and hence the diffusion rate of silver ions is lower. Thus, if the filament FL reaches the upper surface of the high oxygen concentration region $2b$, then in the low oxygen concentration region $2a$, the filament FL further continues to grow in the in-plane direction parallel to the upper surface of the high oxygen concentration region $2b$. In contrast, in the high oxygen concentration region $2b$, the filament FL extends toward the lower electrode 3 more slowly than in the low oxygen concentration region. Consequently, in the high oxygen concentration region $2b$, with the application voltage controlled so that the filament FL does not grow significantly in the horizontal direction, the filament FL can reach the upper surface of the lower electrode 3 and can be connected thereto. As described above, writing is performed, and the memory cell MC is turned to the ON state.

In the memory cell MC according to this embodiment, in the ON state, the tip of the filament FL is not brought into excessive contact with the upper surface of the lower electrode 3. Thus, at writing time, when a small signal voltage is applied to the memory cell in the forward and reverse direction, the filament FL can be easily connected to the lower electrode 3, and easily disconnected from the lower electrode 3. That is, the memory cell MC has good rectification characteristics. Furthermore, the oxygen concentration of the high oxygen concentration region $2b$ is set to $1\times10^{20}/cm^3$ or more. Thus, the effect of suppressing the diffusion of silver ions tends to be saturated. Hence, variations in the rectification characteristics among the memory cells MC are small, and the rectification characteristics can be stabilized.

In contrast, in the memory cell MCC according to the comparative example, the ion diffusion layer $2a$ is composed only of non-doped amorphous silicon. Thus, at writing time, a silver filament FL rapidly extends toward the lower electrode 3. Thus, in contrast to the memory cell MC according to this embodiment, it is difficult to control the magnitude of the application voltage so as to stop the growth of the filament FL at the time when the tip of the filament FL reaches the lower electrode 3. Consequently, in the memory cell MCC according to the comparative example, the tip of the filament FL is brought into excessive contact with the lower electrode 3. For instance, the filament FL further grows in the in-plane direction parallel to the upper surface of the lower electrode 3. Thus, the contact cross-sectional area between the filament FL and the lower electrode 3 may become excessively large.

If the tip of the filament FL is brought into excessive contact with the lower electrode 3, the filament FL is not easily disconnected from the lower electrode 3 despite application of a reverse voltage to the memory cell MCC. That is, in the memory cell MCC according to the comparative example, compared with the memory cell MC according to this embodiment, it is difficult to achieve good rectification characteristics. Furthermore, variations in the rectification characteristics among the memory cells MCC are large. Moreover, the reverse current of the memory cells MCC may be increased.

In the MC according to this embodiment, the ion diffusion layer 2 includes a low oxygen concentration region $2a$ above a high oxygen concentration region $2b$. With the increase of oxygen concentration, amorphous silicon tends to have poorer adhesiveness to the metal electrode. Thus, if the ion diffusion layer 2 is composed only of the high oxygen concentration region $2b$, the adhesiveness to the upper electrode 1 is degraded. Hence, for instance, generation of voids occurs at the interface between the upper electrode 1 and the ion diffusion layer 2, and causes electrode peeling. This results in malfunctions of memory cells MC and causes the yield decrease of memory cells MC.

In the memory cell MC according to this embodiment, the ion diffusion layer 2 is formed so as to include a low oxygen concentration region $2a$ and a high oxygen concentration region $2b$. The upper electrode 1 is brought into close contact with the upper surface of the low oxygen concentration region $2a$. Consequently, in the memory cell MC according to this embodiment, the occurrence of electrode peeling is suppressed, and high yield is achieved. Furthermore, variations in the operating characteristics among the memory cells MC are small. The operation of the memory cells MC is stable among the memory cells MC.

Furthermore, in the low oxygen concentration region 2a, the diffusion rate of silver ions is faster than in the high oxygen concentration region 2b. Thus, in the low oxygen concentration region 2a, a silver filament is formed more reliably than in the high oxygen concentration region 2b. Furthermore, even under application of voltage in the reverse bias direction of the memory cell, because the filament is reliably formed, the filament FL is not easily retracted to the upper electrode side and eliminated in the low oxygen concentration region 2a. Thus, the erasure voltage is high. That is, the high oxygen concentration region 2b improves the rectification characteristics of the memory cell MC. On the other hand, the low oxygen concentration region 2a reliably establishes the ON state and the OFF state, and realizes switching characteristics with higher durability. Furthermore, the low oxygen concentration region 2a improves the adhesiveness between the ion diffusion layer 2 and the upper electrode 1.

As described above, in the nonvolatile semiconductor storage device according to this embodiment, the ion diffusion layer 2 of the memory cell MC includes a low oxygen concentration region 2a and a high oxygen concentration region 2b. Thus, the nonvolatile semiconductor storage device according to this embodiment can have good rectification characteristics and switching characteristics with higher durability. Furthermore, in the nonvolatile semiconductor storage device according to this embodiment, the adhesiveness between the ion diffusion layer 2 and the upper electrode 1 is high. Thus, the yield of memory cells is high.

This embodiment has been described in the case where the lower electrode 3 is made of n-type polysilicon. In this case, when a reverse bias voltage is applied to the memory cell MC, a depletion layer extends from the interface between the lower electrode 3 and the ion diffusion layer 2 to the lower electrode 3 side. This further ensures that the tip of the filament FL is electrically disconnected from the lower electrode 3. Consequently, the nonvolatile semiconductor storage device according to this embodiment achieves more remarkable rectification characteristics.

In the case where the lower electrode 3 is made of p-type polysilicon, when a reverse bias voltage is applied to the memory cell MC, no depletion layer is formed in the lower electrode 3. Consequently, the rectification characteristics of the memory cell MC are poorer than in the case where the lower electrode 3 is made of n-type polysilicon. However, the memory cell MC has at least the rectification characteristics achieved by retraction of the filament FL to the upper electrode 1 side. Thus, even in the case where the lower electrode 3 is made of p-type polysilicon, the aforementioned effect of the nonvolatile semiconductor storage device according to this embodiment can be achieved.

Alternatively, the lower electrode 3 can be made of a metal. In this case, the lower electrode 3 can be formed from any metal as long as the metal material is less likely to thermally diffuse into the ion diffusion layer 2. For instance, in the case where the ion diffusion layer is made of silicon, the lower electrode 3 can be made of e.g. titanium nitride (TiN), molybdenum (Mo), or tantalum (Ta).

This embodiment has been described with reference to the example in which the ion diffusion layer 2 is made of amorphous silicon. However, it is also possible to use polysilicon. Alternatively, it is possible to use silicon nitride (SiN), silicon oxide ($SiO_x$), or silicon oxynitride ($SiNO_x$). Furthermore, it is possible to use transition metal oxides such as titanium oxide ($TiO_x$), cobalt oxide ($CoO_x$), nickel oxide ($NiO_x$), copper oxide ($CuO_x$), molybdenum oxide ($MoO_x$), or hafnium oxide ($HfO_x$). In the case where the ion diffusion layer 2 is made of oxide, the low oxygen concentration region 2a and the high oxygen concentration region 2b can be formed by adjusting the supply of oxygen raw material in forming oxide films.

This embodiment has been described with reference to the example in which the low oxygen concentration region 2a of the ion diffusion layer 2 is made of non-doped amorphous silicon. However, it is also possible to use amorphous silicon doped with oxygen. That is, the low oxygen concentration region 2a may be formed so as to contain oxygen at a nearly uniform concentration in the depth direction. In this case, the oxygen concentration of the low oxygen concentration region 2a only needs to be sufficiently lower than the oxygen concentration of the high oxygen concentration region 2b so that the diffusion rate of silver ions is made substantially different. In the case of intentionally doping oxygen as described above, the oxygen concentration is set to $1 \times 10^{20}/cm^3$ or less, and preferably $1 \times 10^{19}/cm^3$ or less, in order to ensure the diffusion of metal from the upper electrode 1 into the ion diffusion layer 2 and to improve the adhesiveness between the upper electrode 1 and the ion diffusion layer 2.

This embodiment has been described with reference to the example in which the film thickness of the low oxygen concentration region 2a of the ion diffusion layer 2 is 5 nm. To reduce the voltage for writing to the memory cell, the film thickness needs to be set to 10 nm or less, and preferably 5 nm or less. To reduce the reverse current, the film thickness of the low oxygen concentration region 2a is preferably set to 3 nm or more.

In this embodiment, as described above, the oxygen concentration of the high oxygen concentration region 2b is preferably $1 \times 10^{20}/cm^3$ or more to reliably suppress the diffusion of metal. To ensure the heat resistance of the process, the oxygen concentration of the high oxygen concentration region 2b is preferably set to $2 \times 10^{22}/cm^3$ or more.

This embodiment has been described with reference to the example in which the film thickness of the high oxygen concentration region 2b is 5 nm. To reduce the voltage for writing to the memory cell, it is desirable that the film thickness be 10 nm or less, and preferably 5 nm or less. To reduce the reverse current, the film thickness of the high oxygen concentration region 2b is preferably set to 3 nm or more.

In the case where the oxygen concentration of the low oxygen concentration region 2a and the high oxygen concentration region 2b is not uniform in the depth direction, the average in the depth direction only needs to be set to the aforementioned concentration.

This embodiment has been described with reference to the example in which the upper electrode 1 is made of silver. However, the upper electrode 1 can be formed from any other metallic element as long as it is a metallic element diffusing from the upper electrode 1 into the ion diffusion layer when a positive voltage relative to the lower electrode 3 is applied to the upper electrode 1. For instance, in the case where the ion diffusion layer 2 is composed of silicon, the upper electrode 1 can be composed of Cu, Al, Co, Ni, or Ti.

Next, a method for manufacturing a nonvolatile semiconductor storage device according to this embodiment is described with reference to FIGS. 9 to 14. FIGS. 9 to 14 are main part schematic sectional views showing part of the process for manufacturing a nonvolatile semiconductor storage device according to the first embodiment.

Figure 9:
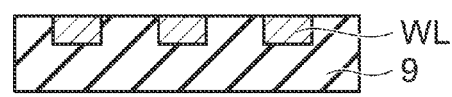
FIG. 9 is a main part schematic sectional view showing a part of the process for manufacturing a nonvolatile semiconductor storage device according to the first embodiment.

Although not shown, control sections for the memory cell array are formed from MOSFETs (metal oxide semiconductor field effect transistors) and contact layers on a silicon substrate. On these control sections, to insulate them from above, an interlayer insulating film 9 is formed. The interlayer insulating film 9 is made of e.g. silicon oxide. However, the interlayer insulating film 9 can be made of any other insulator such as silicon nitride or silicon oxynitride. As shown in FIG. 9, in the surface of the interlayer insulating film 9, a metal such as tungsten (W) is used to form word lines WL by the damascene method. The word line WL can be made of any conductive material such as conductive polysilicon. The word lines WL extend like stripes in the direction perpendicular to the page. The word lines WL are arranged in a plurality in the horizontal direction of the page to constitute a first word line wiring layer.

Figure 10:
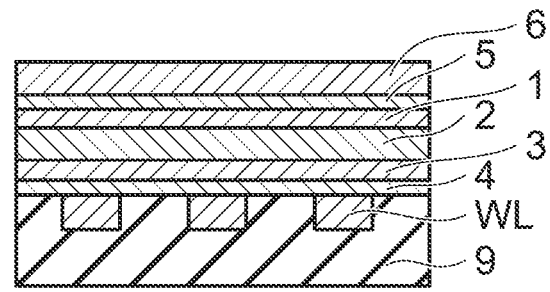
FIG. 10 is a main part schematic sectional view showing a part of the process for manufacturing a nonvolatile semiconductor storage device according to the first embodiment.

Next, as shown in FIG. 10, a barrier metal layer 4, a lower electrode 3, an ion diffusion layer 2, an upper electrode 1, a barrier metal layer 5, and a bit line contact metal layer 6 are sequentially formed so as to entirely cover the surface of the interlayer insulating film 9 and the plurality of word lines WL. The barrier metal layer 5 can be composed of e.g. ruthenium (Ru), titanium (Ti), tantalum (Ta), tungsten (W), hafnium (Hf), or aluminum (Al). The barrier metal 4 suppresses diffusion of the word line WL into the lower electrode 3. In the case where the diffusion between the word line WL and the lower electrode 3 causes no problem, the barrier layer 4 is not necessarily needed.

The ion diffusion layer 2 is formed by film formation of amorphous silicon by the CVD method. The ion diffusion layer 2 includes a high oxygen concentration region 2b on the side electrically connected to the lower electrode 3, and a low oxygen concentration region 2a on the side electrically connected to the upper electrode 1. The high oxygen concentration region 2b is formed by supplying oxygen raw material during film formation of amorphous silicon and not supplying other impurity raw material. The low oxygen concentration region 2a is formed, in this embodiment, by film formation of non-doped amorphous silicon. In the case where oxygen is intentionally contained in the low oxygen concentration region 2a, the low oxygen concentration region 2a is formed by film formation of amorphous silicon at a lower supply of oxygen raw material than for the high oxygen concentration region 2b.

The upper electrode 1 is composed of silver. The barrier layer 5 is composed of the same material as the barrier layer 4. The barrier layer 5 is provided to avoid mixing of the upper electrode 1 and the bit line contact metal 6. The bit line contact metal 6 is composed of a metal such as tungsten. The bit line contact metal 6 is provided to improve electrical connection to the bit line BL to be formed later. The bit line contact metal 6 only needs to be a conductive material, and can be any other metal or conductive polysilicon.

Figure 11:
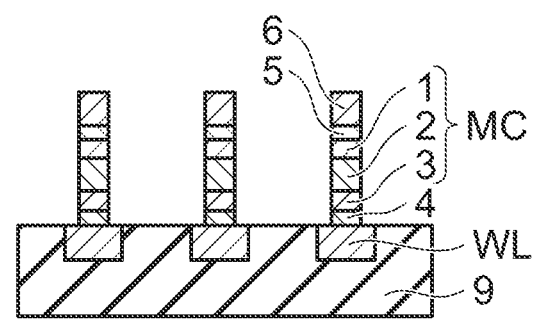
FIG. 11 is a main part schematic sectional view showing a part of the process for manufacturing a nonvolatile semiconductor storage device according to the first embodiment.

Next, as shown in FIG. 11, using a mask, not shown, RIE is used to etch the bit line contact metal 6, the barrier layer 5, the upper electrode 1, the ion diffusion layer 2, the lower electrode 3, and the barrier layer 4. Consequently, on each word line WL in the first word line wiring layer, pillars (columnar structures) of the stacked body of the barrier metal 4, the lower electrode 3, the ion diffusion layer 2, the upper electrode 1, the barrier metal 5, and the bit line contact metal 6 are formed. These pillars are formed in a plurality and spaced from each other in the extending direction of the word line WL. The pillar includes a memory cell MC composed of the lower electrode 3, the ion diffusion layer 2, and the upper electrode 1. This plurality of pillars constitute a first memory cell layer. The pillar is electrically connected to the word line WL in the first word line wiring layer by the barrier metal 4 at the bottom.

Figure 12:
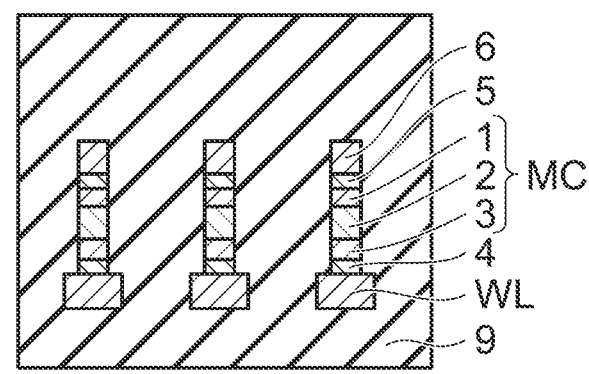
FIG. 12 is a main part schematic sectional view showing a part of the process for manufacturing a nonvolatile semiconductor storage device according to the first embodiment.

Next, as shown in FIG. 12, an interlayer insulating film 9 is formed so as to be buried between the aforementioned plurality of pillars. The interlayer insulating film 9 is formed so as to cover the top of the aforementioned plurality of pillars. Then, the CMP method is used to planarize the top of the interlayer insulating film 9. Using a mask, not shown, the RIE method is used to form a trench, not shown, in the surface of the interlayer insulating film 9. The trench reaches the bit line contact metal 6 and extends in the direction orthogonal to the word lines WL.

Figure 13:
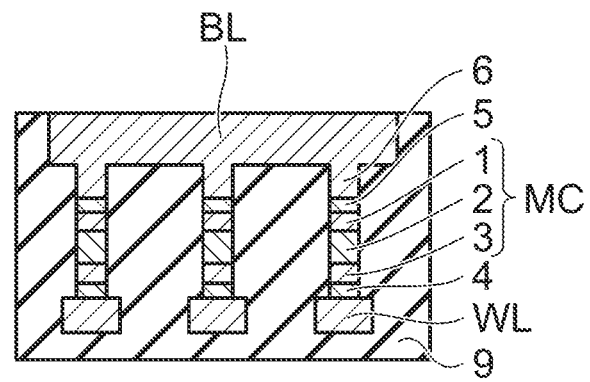
FIG. 13 is a main part schematic sectional view showing a part of the process for manufacturing a nonvolatile semiconductor storage device according to the first embodiment.

Then, as shown in FIG. 13, a bit line BL is formed by the damascene method so as to be buried in the trench of the interlayer insulating film 9. Consequently, a plurality of bit lines BL are formed in the plane parallel to the first word line wiring layer. The bit line BL extends in the direction orthogonal to the word lines WL and is electrically connected to the bit line contact metal 6. This plurality of bit lines BL constitute a first bit line wiring layer.

Figure 14:
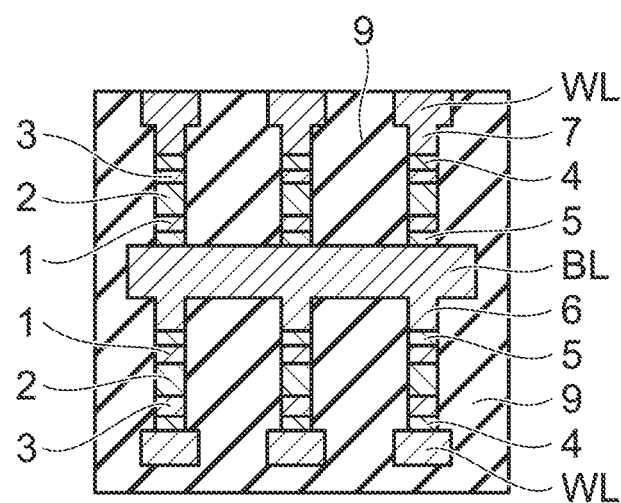
FIG. 14 is a main part schematic sectional view showing a part of the process for manufacturing a nonvolatile semiconductor storage device according to the first embodiment.

Next, as shown in FIG. 14, a barrier metal 5, an upper electrode 1, an ion diffusion layer 2, a lower electrode 3, a barrier metal 4, and a word line contact metal 7 are sequentially formed so as to cover the plurality of bit lines BL and the interlayer insulating film 9. The stacking order of the upper electrode 1, the ion diffusion layer 2, the lower electrode 3 constituting the memory cell MC is vertically opposite to the order in the first memory cell layer. Likewise, the stacking order of the low oxygen concentration region 2a and the high oxygen concentration region 2b in the ion diffusion layer 2 is also vertically opposite to the order in the first memory cell layer. The word line contact metal 7 is composed of a metal such as tungsten. The word line contact metal 7 is provided to improve electrical connection to the word line WL to be formed later. The word line contact metal 7 only needs to be a conductive material, and can be any other metal or conductive polysilicon.

Next, using a mask, not shown, like the formation of the plurality of pillars in the first memory cell layer, the RIE method is used to etch the word line contact metal 7, the barrier metal 4, the lower electrode 3, the ion diffusion layer 2, the upper electrode 1, and the barrier metal 5. Consequently, on each bit line BL in the first bit line wiring layer, pillars of the stacked body of the barrier metal 5, the upper electrode 1, the ion diffusion layer 2, the lower electrode 3, the barrier metal 4, and the word line contact metal 7 are formed. These pillars are formed in a plurality and spaced from each other in the extending direction of the bit line BL. The pillar includes a memory cell MC composed of the lower electrode 3, the ion diffusion layer 2, and the upper electrode 1. This plurality of pillars constitute a second memory cell layer. The pillar is electrically connected to the bit line BL in the first bit line wiring layer by the barrier metal 5 at the bottom.

Next, similarly to FIG. 12, on the interlayer insulating film 9 in the first bit line wiring layer and on the plurality of bit lines BL, an interlayer insulating film 9 is further formed so as to be buried between the aforementioned plurality of pillars. The interlayer insulating film 9 is formed so as to cover the top of the aforementioned plurality of pillars. Then, the CMP method is used to planarize the top of the interlayer insulating film 9. Using a mask, not shown, the RIE method is used to form a trench, not shown, in the surface of the interlayer insulating film 9. The trench reaches the word line contact metal 7 and extends in the same direction as the word lines WL in the first word line wiring layer.

Then, as shown in FIG. 14, a word line WL is formed by the damascene method so as to be buried in the trench of the interlayer insulating film 9. Consequently, a plurality of word lines WL are formed in the plane parallel to the first word line wiring layer. The word line WL extends in the same direction as the word lines WL in the first word line wiring layer and is electrically connected to the word line contact metal 7. This plurality of word lines WL constitute a second word line wiring layer.

Subsequently, the process for manufacturing the first word line wiring layer, the first memory cell layer, the first bit line wiring layer, and the second memory cell layer is repeated to provide a nonvolatile semiconductor storage device according to this embodiment including a memory cell array with memory cells MC formed three-dimensionally.

Second Embodiment

Figure 15:
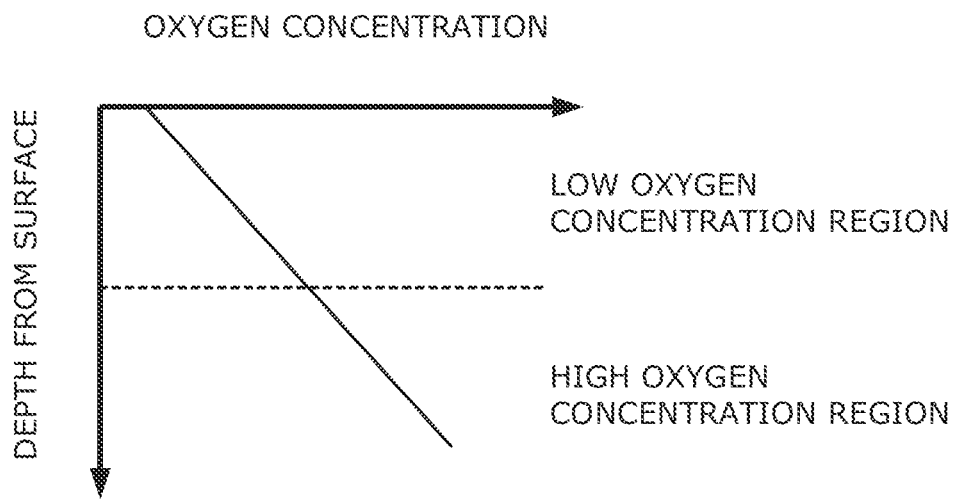
FIG. 15 is a graph of the concentration of oxygen in the ion diffusion layer of the nonvolatile semiconductor storage device according to a second embodiment.

A nonvolatile semiconductor storage device according to a second embodiment is described with reference to FIG. 15. FIG. 15 shows the distribution of oxygen concentration in the ion diffusion layer 2 of the nonvolatile semiconductor storage device according to the second embodiment. The portions having the same configuration as those described in the first embodiment are labeled with like reference numerals or symbols, and the description thereof is omitted. The differences from the first embodiment are primarily described.

The cross-sectional structure of the memory cell MC of the nonvolatile semiconductor storage device according to this embodiment is the same as the cross-sectional structure of the memory cell according to the first embodiment shown in FIG. 1. The memory cell MC according to this embodiment is different from that according to the first embodiment in the depth profile of oxygen concentration in the ion diffusion layer 2. The depth profile of oxygen concentration in the ion diffusion layer 2 of the memory cell MC according to this embodiment is shown in FIG. 15.

The oxygen concentration in the ion diffusion layer 2 monotonically increases from the interface between the ion diffusion layer 2 and the upper electrode 1 toward the interface between the ion diffusion layer 2 and the lower electrode 3. In contrast to the oxygen concentration profile in the ion diffusion layer 2 according to the first embodiment, the oxygen concentration profile in the ion diffusion layer 2 according to this embodiment has no clear boundary between the low oxygen concentration region 2a and the high oxygen concentration region 2b. However, for convenience, in the ion diffusion layer 2, the upper electrode 1 side is referred to as low oxygen concentration region 2a, and the other lower electrode 3 side is referred to as high oxygen concentration region 2b. The boundary between the low oxygen concentration region 2a and the high oxygen concentration region 2b can be considered arbitrarily. Wherever the boundary is located, the oxygen concentration at an arbitrary depth of the high oxygen concentration region 2b is higher than the oxygen concentration at any depth of the low oxygen concentration region 2a. Furthermore, wherever the boundary is located, the average of the oxygen concentration in the depth direction of the high oxygen concentration region 2b is higher than the average of the oxygen concentration of the low oxygen concentration region 2a.

Also in the nonvolatile semiconductor storage device according to this embodiment, as in the nonvolatile semiconductor storage device according to the first embodiment, the high oxygen concentration region 2b is provided in the ion diffusion layer 2. Thus, excessive diffusion of silver ions is suppressed. This suppresses the reverse current and improves the rectification characteristics. Furthermore, the low oxygen concentration region 2a is provided in the ion diffusion layer 2. This improves the adhesiveness between the ion diffusion layer 2 and the upper electrode 1, and increases the yield of memory cells MC. Moreover, in the low oxygen concentration region 2a, the diffusion of silver ions is favorable. This improves the switching characteristics of the memory cell MC, and achieves high durability as well.

Third Embodiment

Figure 16:
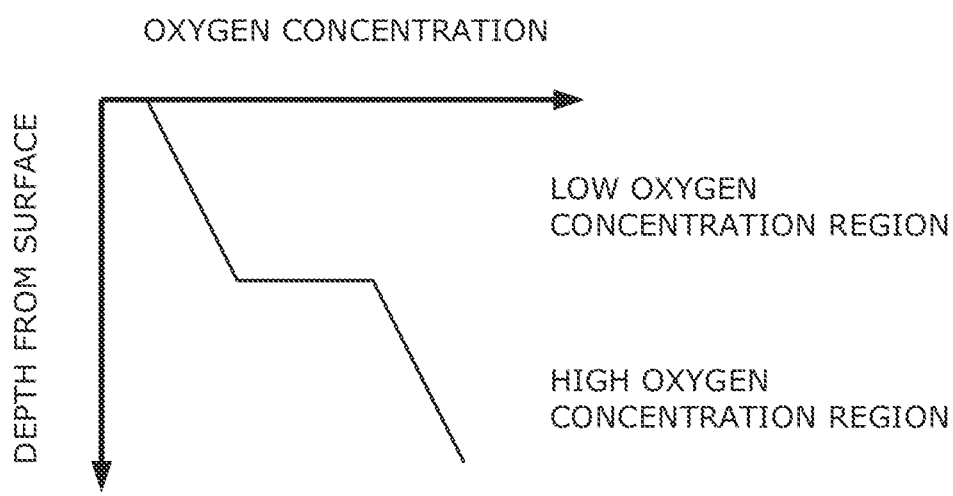
FIG. 16 is a graph of the concentration of oxygen in the ion diffusion layer of the nonvolatile semiconductor storage device according to a third embodiment.

A nonvolatile semiconductor storage device according to a third embodiment is described with reference to FIG. 16. FIG. 16 shows the distribution of oxygen concentration in the ion diffusion layer 2 of the nonvolatile semiconductor storage device according to the third embodiment. The portions having the same configuration as those described in the first embodiment are labeled with like reference numerals or symbols, and the description thereof is omitted. The differences from the first embodiment are primarily described.

The cross-sectional structure of the memory cell MC of the nonvolatile semiconductor storage device according to this embodiment is the same as the cross-sectional structure of the memory cell according to the first embodiment shown in FIG. 1. The memory cell MC according to this embodiment is different from that according to the first embodiment in the depth profile of oxygen concentration in the ion diffusion layer 2. The depth profile of oxygen concentration in the ion diffusion layer 2 of the memory cell MC according to this embodiment is shown in FIG. 16.

Like the ion diffusion layer 2 of the memory cell MC according to the first embodiment, the ion diffusion layer 2 of the memory cell MC according to this embodiment includes a low oxygen concentration region 2a having a thickness of 5 nm and a high oxygen concentration region 2b having a thickness of 5 nm. As shown in FIG. 16, the oxygen concentration in the low oxygen concentration region 2a according to this embodiment monotonically increases from the interface between the upper electrode 1 and the ion diffusion layer 2 to the boundary between the low oxygen concentration region 2a and the high oxygen concentration region 2b. The oxygen concentration of the high oxygen concentration region 2b is higher than the oxygen concentration of the low oxygen concentration region 2a at the boundary between the low oxygen concentration region 2a and the high oxygen concentration region 2b, and monotonically increases to the interface between the ion diffusion layer 2 and the lower electrode 3. In this point, the nonvolatile semiconductor storage device according to this embodiment is different from the nonvolatile semiconductor storage device according to the first embodiment.

The oxygen concentration at an arbitrary depth of the high oxygen concentration region 2b is higher than the oxygen concentration at any depth of the low oxygen concentration region 2a. Furthermore, the average of the oxygen concentration in the depth direction of the high oxygen concentration region 2b is higher than the average of the oxygen concentration in the depth direction of the low oxygen concentration region 2a.

Also in the nonvolatile semiconductor storage device according to this embodiment, as in the nonvolatile semiconductor storage device according to the first embodiment, the high oxygen concentration region 2b is provided in the ion diffusion layer 2. Thus, excessive diffusion of silver ions is suppressed. This suppresses the reverse current and improves the rectification characteristics. Furthermore, the low oxygen concentration region 2a is provided in the ion diffusion layer 2. This improves the adhesiveness between the ion diffusion layer 2 and the upper electrode 1, and increases the yield of memory cells MC. Moreover, in the low oxygen concentration region 2a, the diffusion of silver ions is favorable. This improves the switching characteristics of the memory cell MC, and achieves high durability as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
    a word line made of a conductive material extending in a first direction;
    a first electrode provided on the word line and electrically connected to the word line;
    a high resistance ion diffusion layer provided on the first electrode on opposite side from the word line and electrically connected to the first electrode, the ion diffusion layer including a high oxygen concentration region and a low oxygen concentration region, the high oxygen concentration region being in contact with the first electrode, the low oxygen concentration region being provided on the high oxygen concentration region, the low oxygen concentration region being in contact with the high oxygen concentration region, the high oxygen concentration region having a higher oxygen concentration than the low oxygen concentration region;
    a second electrode provided on the ion diffusion layer on opposite side from the word line, the second electrode being in contact with the low oxygen concentration region, the second electrode being configured to supply a metal into the low oxygen concentration region upon application of a positive voltage relative to the first electrode; and
    a bit line provided on the second electrode on opposite side from the word line, electrically connected to the second electrode, and made of a conductive material extending in a second direction orthogonal to the first direction,
    the second electrode including the metal supplied into the low oxygen concentration region.

2. The device according to claim 1, wherein average oxygen concentration of the high oxygen concentration region is higher than average oxygen concentration of the low oxygen concentration region.

3. The device according to claim 1, wherein the low oxygen concentration region is formed so as not to contain oxygen, and the high oxygen concentration region is formed so as to contain oxygen.

4. The device according to claim 1, wherein the high oxygen concentration region has an oxygen concentration of $1 \times 10^{20}/cm^3$ or more in its entire region.

5. The device according to claim 1, wherein the ion diffusion layer is composed of Si.

6. The device according to claim 5, wherein the ion diffusion layer is composed of amorphous silicon.

7. The device according to claim 1, wherein the ion diffusion layer is composed of one of SiN, SiOx, SiNOx, TiOx, CoOx, NiOx, CuOx, MoOx, and HfOx.

8. The device according to claim 1, wherein the second electrode is composed of one of Ag, Cu, Al, Co, Ni, and Ti.

9. The device according to claim 1, wherein the first electrode is composed of n-type conductive polysilicon.

10. The device according to claim 1, wherein the first electrode is composed of p-type conductive polysilicon.

11. The device according to claim 1, wherein the first electrode is composed of one of TIN, Mo, and Ta.

12. The device according to claim 1, wherein in the ion diffusion layer, oxygen concentration monotonically increases from the bit line side toward the word line side.

* * * * *

UNITED STATES PATENT AND TRADEMARK OFFICE
CERTIFICATE OF CORRECTION

PATENT NO. : 8,772,753 B2  
APPLICATION NO. : 13/596395  
DATED : July 8, 2014  
INVENTOR(S) : Baba Page 1 of 1

It is certified that error appears in the above-identified patent and that said Letters Patent is hereby corrected as shown below:

IN THE CLAIMS

Claim 11, column 16, line 32, change "TIN" to --TiN--.

Signed and Sealed this  
Fourth Day of November, 2014

Michelle K. Lee  
*Deputy Director of the United States Patent and Trademark Office*